US007050320B1

(12) United States Patent
Lai et al.

(10) Patent No.: US 7,050,320 B1
(45) Date of Patent: May 23, 2006

(54) MEMS PROBE BASED MEMORY

(75) Inventors: Stefan Lai, Woodside, CA (US); Albert Fazio, Saratoga, CA (US); Valluri Rao, Saratgoa, CA (US); Mike Brown, Phoenix, AZ (US); Krishnamurthy Murali, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/021,859

(22) Filed: Dec. 23, 2004

(51) Int. Cl.
*G11C 5/06* (2006.01)
(52) U.S. Cl. .................. 365/63; 365/174; 365/201; 365/189.01; 257/414
(58) Field of Classification Search ............. 365/63, 365/174, 201, 189.01; 257/414
See application file for complete search history.

(56) References Cited

U.S. PATENT DOCUMENTS 5,886,922 A * 3/1999 Saito et al. ............... 365/164

6,611,033 B1 * 8/2003 Hsu et al. ................. 257/414

* cited by examiner

*Primary Examiner*—Richard Elms
*Assistant Examiner*—N Nguyen
(74) *Attorney, Agent, or Firm*—Kevin A. Reif (57) ABSTRACT

Briefly, in accordance with one embodiment of the invention, a memory device may include a memory layer and a MEMS layer. The memory layer may include an integrated circuit with a multiplexer and optionally a memory controller and a storage medium disposed on the integrated circuit where the storage medium includes chalcogenide islands as storage elements. The MEMS layer may include a movable MEMS platform having probes to connect selected chalcogenide islands via positioning of the MEMS platform. A high voltage source disposed external to the memory layer and the MEMS layer may provide a high voltage to a stator electrode on the memory layer and to a rotor electrode on the MEMS platform to control movement of the MEMS platform with respect to the storage medium. The memory device may be utilized in portable electronic devices such as media players and cellular telephones to provide a nonvolatile storage of information.

40 Claims, 5 Drawing Sheets

FIG. 5

MEMS PROBE BASED MEMORY

BACKGROUND OF THE INVENTION

Hand held portable electronic devices are converging with computing devices with the incorporation of additional features while maintaining relative size or decreasing in size. As a result, such devices may take advantage of storage capacity at higher densities to accommodate the additional features. Such portable electronic devices may therefore take advantage of nonvolatile memory architectures, methods and means that provide higher storage densities to store more information content such as audio, video, and data files.

DESCRIPTION OF THE DRAWING FIGURES

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail.

In the following description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Figure 1:
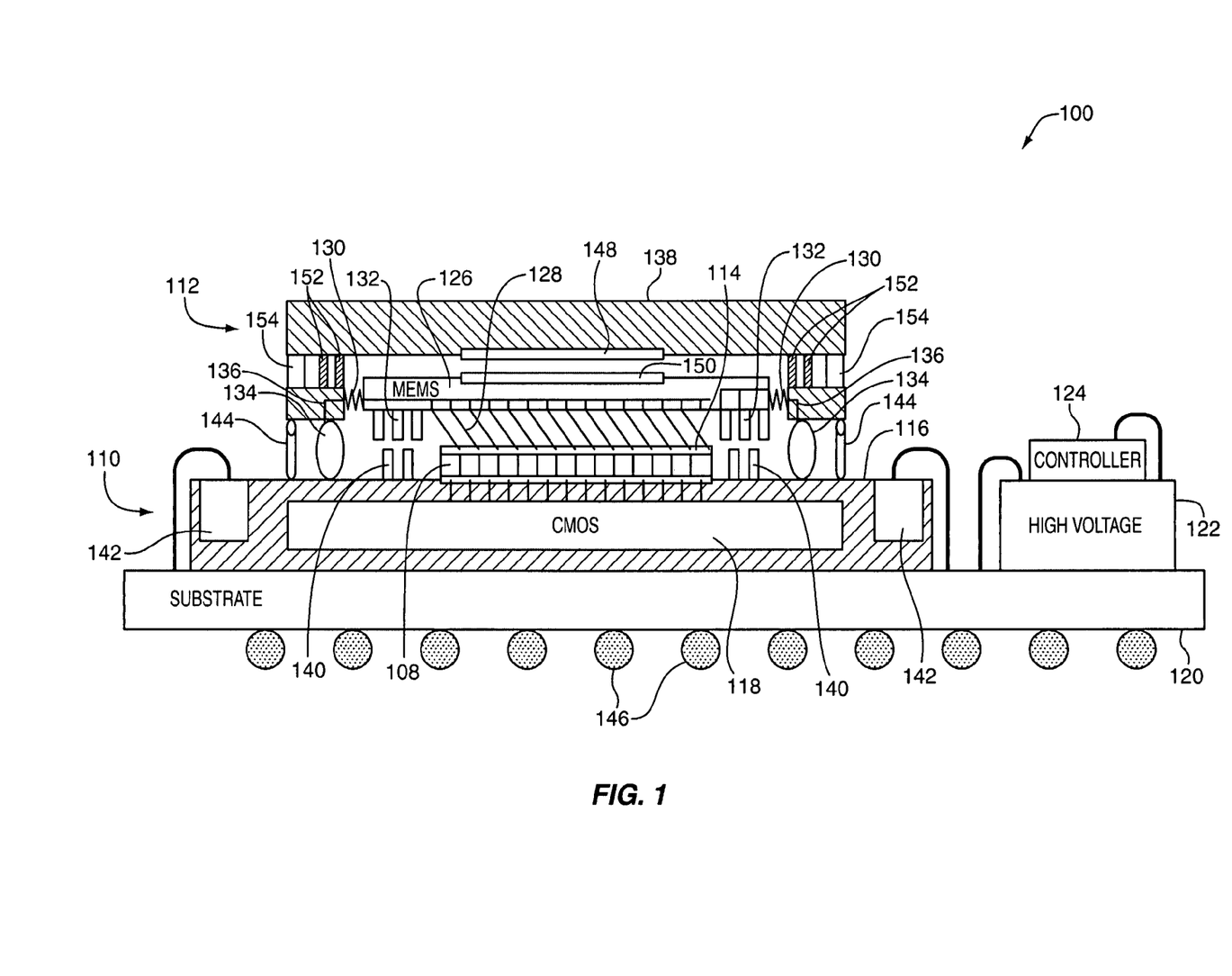
FIG. 1 is an elevation view of a schematic diagram of a memory device in accordance with one or more embodiments of the present invention.

Referring now to FIG. 1, an cross section, elevation view of a schematic diagram of a memory device in accordance with one or more embodiments of the present invention will be discussed. The structures identified in FIG. 1 represent a two dimensional rendering of a three dimensional structure where certain elements like, but not limited to the patterned lines 136, springs 130, rotor electrodes 132 and stator electrodes 140 are instantiated with an orthogonal orientation to the structures shown in this figure. The memory device 100 as shown in FIG. 1 may include an active memory layer substrate 110 and a microelectromechanical system (MEMS) layer 112. Memory layer 110 may include a chalcogenide based storage medium 114 deposited on an integrated circuit 116 proximate to a complementary metal oxide semiconductor (CMOS) wafer 118 or the memory layer 114 may be directly deposited on a CMOS wafer 118 that comprises a portion of the area of the memory layer substrate 110 that is covered by the MEMS layer 112. Storage medium 114 includes an array of electrically isolated chalcogenide islands that operate as independent storage elements within the storage medium 114. Circuitry in the CMOS wafer 118 may be utilized for selecting, multiplexing, amplifying and any logic circuits that may be provided for addressing and reading, writing, encoding, decoding and error correcting the information stored on storage medium 114, and may further optionally include a memory controller and interface circuitry for storage medium 114 and the memory device 100, although the scope of the invention is not limited in this respect.

Integrated circuit 116 may be attached to substrate 120 such as a flip chip, along with a high voltage source 122 and a high voltage controller 124 to manage and apply high voltage source 122. In one embodiment of the invention, high voltage source 122 may provide a higher voltage direct current (dc) output, although the scope of the invention is not limited in this respect, for example a high voltage alternating current (ac) may also be provided. Integrated circuit 116 may be stationary with the higher voltage dc value and the time dependant voltages that control the stator electrodes 140 of an X-Y mover system incorporated by memory device 100 as discussed herein. The higher voltage may be generated by high voltage source 122 in a chip disposed external to integrated circuit 116 and brought in through pads 142. In such an arrangement, the higher voltage CMOS circuitry of high voltage source 122 may be separated from the higher performance CMOS circuitry of CMOS wafer 118, although the scope of the invention is not limited in this respect. In one embodiment of the invention, integrated circuit 116 may be a flip chip package and may include one or more solder balls 146 to provide electrical connection between CMOS wafer 118 and external circuits, for example a processor that stores program code or data in memory device 100. In one particular embodiment of the invention, the solder balls 146 may be arranged in a ball grid array disposed on a surface of substrate 120 to provide external connections to memory device 100, although the scope of the invention is not limited in this respect.

Memory device 100 may also include a MEMS layer 112 that comprises a movable MEMS platform 126 having one or more MEMS based probes 128 formed thereon, connection springs 130 to suspend and control the movement of MEMS platform 126, and rotor electrodes 132 that operate as the rotor portion of the X-Y mover system in conjunction with stator electrodes 140. The tips of probes 128 may be individually actively driven or grounded, and the switching operation for selection probes 128 may be accomplished through the circuitry of CMOS wafer 118. The higher voltage for the rotor electrodes 132 of the X-Y mover system may be supplied via integrated circuit 116 through interconnect bumps 134 connected via patterned lines 136 in integrated circuit 112 attached to springs 130 as shown, or alternatively via dedicated probes attached to pad areas on CMOS wafer 118 and medium 114, although the scope of the invention is not limited in this respect. Memory layer 110 and MEMS layer 112 may be coupled via a sealing ring 144 that may provide a hermetic seal between memory layer 110 and MEMS layer 112 similarly MEMS layer 112 may be coupled to capping layer 138 via a sealing ring 147 wherein the space within sealing ring may be evacuated and optionally filled with an inert gas such as nitrogen ($N_2$) or other suitable gas or fluid although the scope of the invention is not limited in this respect. In one embodiment of the invention, memory layer 110, MEMS layer 112 and capping layer 138 may comprise semiconductor structures that may be formed and fabricated using semiconductor fabrication or etching processes, and then hermetically sealed to form a semiconductor package for example as described in U.S. Pat. No. 6,673,697, although the scope of the invention is not limited in this respect. Said patent U.S. Pat. No. 6,673,697 is hereby incorporated herein in its entirety.

Figure 5:
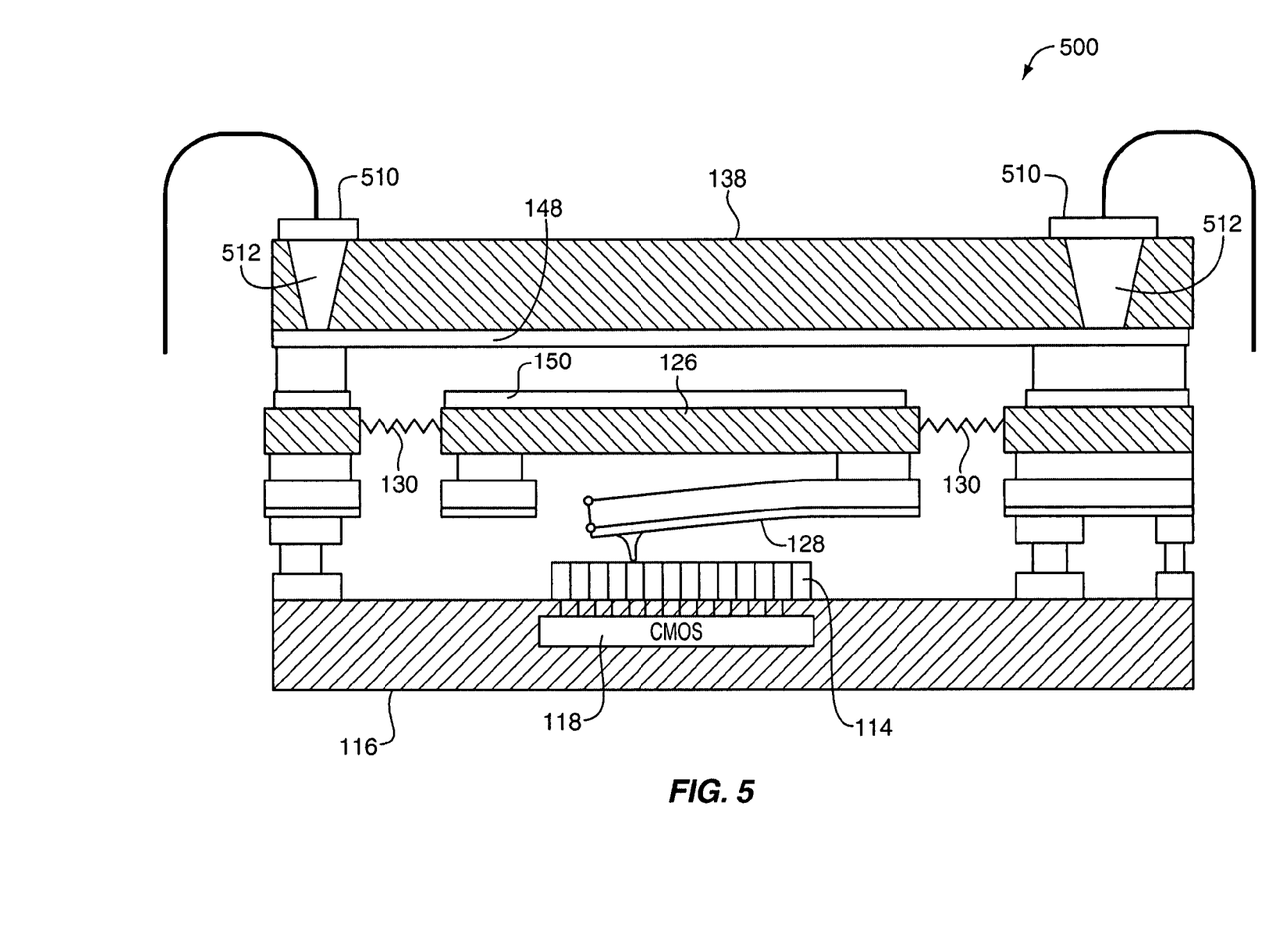

In one embodiment of the invention, capping layer 138 may be a passive structure that may optionally include a shielding layer (not shown) to shield components internal to the capping layer 138 from external electromagnetic interference or to minimize or prevent electromagnetic radiation generated by components internal to capping layer 138 from emanating into the ambient environment. In one particular embodiment of the invention, capping layer 138 may be an active control element to help control movement of MEMS platform 126 with respect to storage medium 114. For example, capping layer 138 may include a first electrode 148 and MEMS platform 126 may include a second electrode wherein controller 124 may cause high voltage source 122 to apply a voltage between first electrode 148 and second electrode 150 when MEMS platform 126 when movement of MEMS platform 126 is desired. In such an arrangement, an attractive electrostatic force may be generated between the first electrode 148 and the second electrode 150 to pull MEMS platform 126 away from storage medium 114 so that the probes 128 of MEMS platform 126 essentially do not contact the islands 108 of storage medium 114 so that lateral movement of MEMS platform 128 is not impeded. When MEMS platform 128 is positioned at a desired selected area of storage medium 114, first electrode 148 and second electrode 150 may be charged to generally the same electrical potential so that MEMS platform 126 may come to a rest at the selected area. In one particular embodiment of the invention, there may be one or more vertically arranged springs (not shown) connected between MEMS platform 126 and capping layer 138 to physically bias the probes 128 of MEMS platform 126 against storage medium 114, although the scope of the invention is not limited in this respect. In an alternative embodiment, the arrangement of MEMS platform 126, storage medium 114, and springs 130 cause MEMS platform 126 to be in an interference position with respect to storage medium 114 when the voltage between first electrode 148 and second electrode 150 is the same or nearly the same, and to be in a non-interference position when the voltage between the electrodes is at a sufficient level to electrostatically pull MEMS platform 126 away from storage medium 114, although the scope of the invention is not limited in this respect. In one embodiment of the invention, control lines for applying the electrostatic control voltage from high voltage source 122 to first electrode 148 in capping layer 138 may pass through interconnect bumps 134 to either of interconnect bumps 152 or 154, although the scope of the invention is not limited in this respect. An alternative arrangement for getting an electrostatic control voltage to capping layer 138 is shown in FIG. 5, although the scope of the invention is not limited in this respect.

Figure 2:
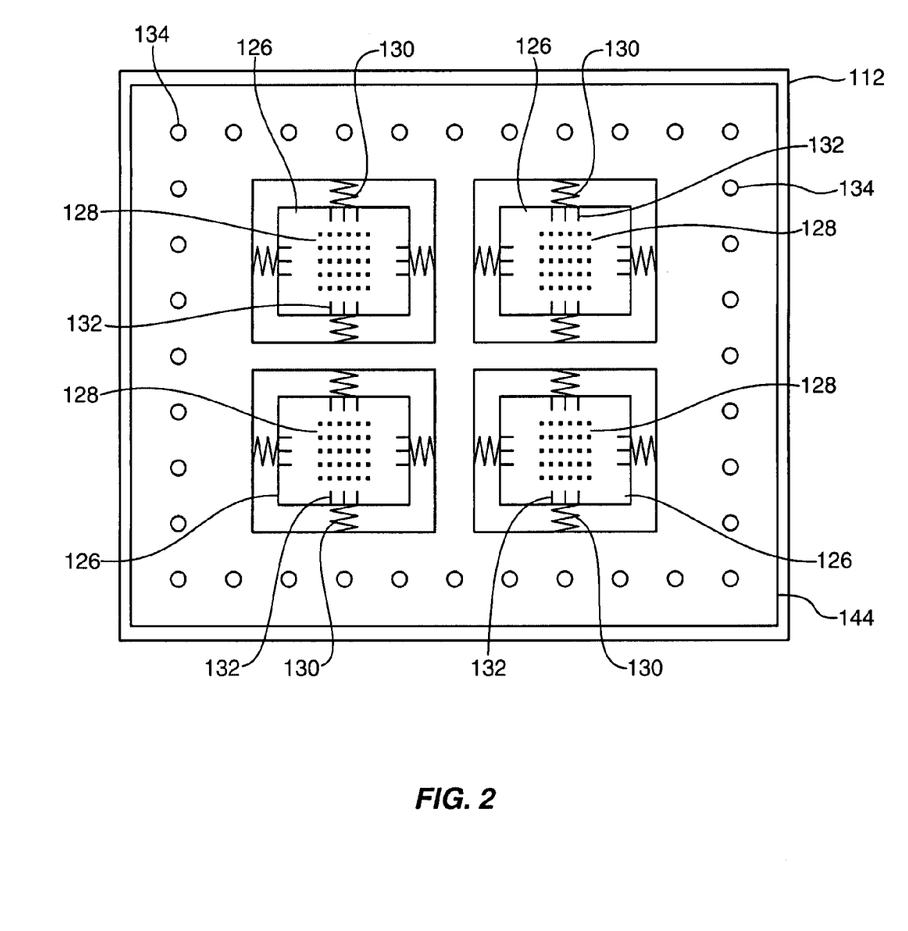
FIG. 2 is a top plan view of a microelectromechanical system (MEMS) chip utilized in a memory device in accordance with one or more embodiments of the present invention.

Referring now to FIG. 2, a top plan view of a microelectromechanical system (MEMS) chip utilized in a memory device in accordance with one or more embodiments of the present invention will be discussed. In the embodiment shown in FIG. 2, MEMS layer 112 may include an array of four MEMS platforms 126 where each of the MEMS platforms 126 may include an array of probes 128. In one embodiment of the invention, probes 128 may comprise silicon tips with electrostatic movers to provide a bit pitch on the order of 25 nanometers, although the scope of the invention is not limited in this respect. Probes may be moved over corresponding chalcogenide islands disposed on storage medium 114 as shown in and discussed with respect to FIG. 3.

Figure 3:
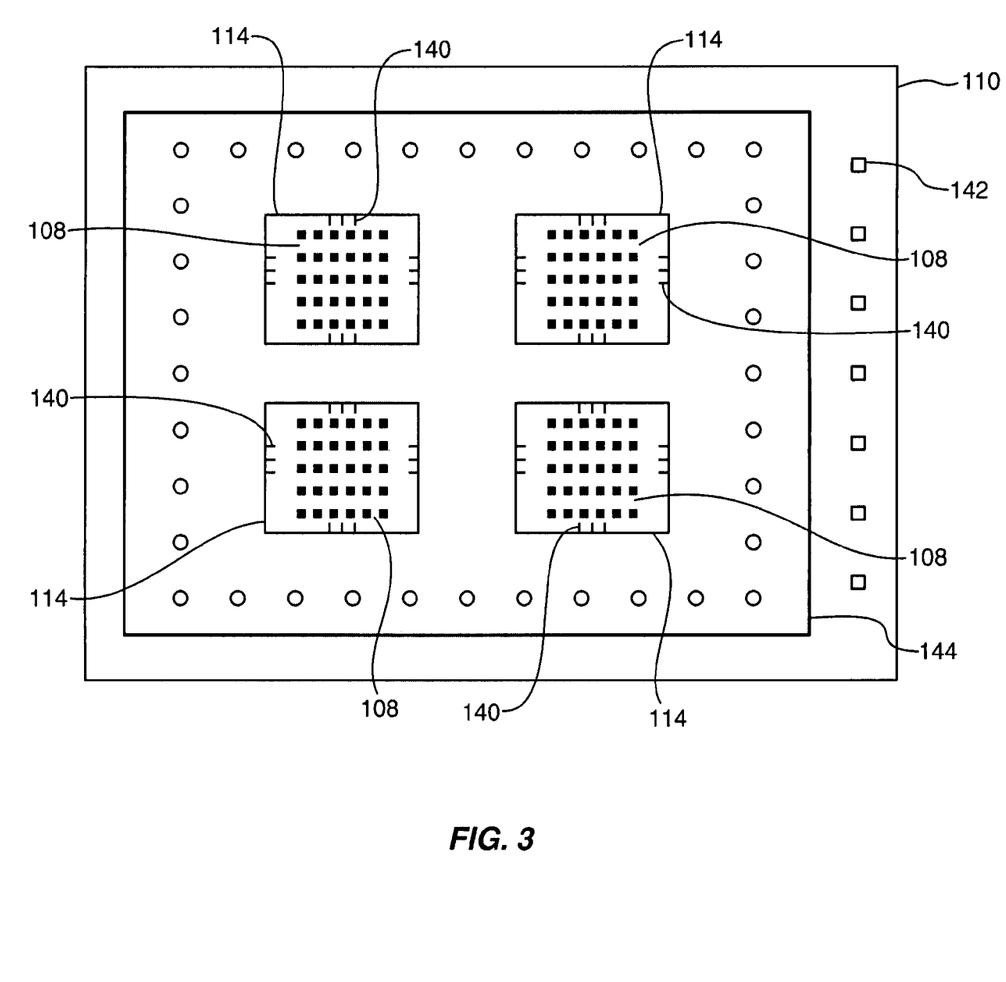
FIG. 3 is a top plan view of a storage medium chip utilized in a memory device in accordance with one embodiment of the present invention.

Referring now to FIG. 3, a top plan view of a storage medium chip utilized in a memory device in accordance with one embodiment of the present invention. Memory layer 110 in the embodiment shown in FIG. 3 may include four arrays of arrays of storage media 114 to correspond with the number of selection probes 128 as shown in FIG. 2, although the scope of the invention is not limited in this respect. In one embodiment of the invention, the chalcogenide islands in the arrays of chalcogenide islands 108 may have a feature size of 100 micrometers, although the scope of the invention is not limited in this respect.

In operation of memory device 100 as shown in FIG. 1 with memory layer 110 as shown in FIG. 2 and MEMS layer 112 as shown in FIG. 3, in one embodiment of the invention there may be a greater number of chalcogenide islands 108 in the arrays of chalcogenide islands than the number of probes 128 in the array of probes. Controller 124 may direct high voltage source 122 to apply a higher voltage dc drive signal to stator electrodes 140 and rotor electrodes 132. In such an arrangement, X-Y movement of a given MEMS platform 126 may be provided and controlled via the application of a desired magnitude and polarity of the voltage so as to position the MEMS platform 126, and thereby probes 128 to desired chalcogenide islands 108 on the array of chalcogenide islands of storage medium 114. When probes 128 are positioned over the desired chalcogenide islands 108, a time varying voltage or current may be applied through a selected probe 126 relative to a selected chalcogenide island 108 to change the state or phase of the island and thereby to store or erase a bit stored at the current physically addressed position in the island. Likewise, a read sensing time varying voltage or current may be applied through a selected probe to read a bit stored at the current physically addressed position in a selected probe island, although the scope of the invention is not limited in this respect. A description of how a memory system may be constructed by utilizing a chalcogenide based storage medium may be provided for purposes of example by U.S. Pat. No. 6,462,984, U.S. Pat. No. 6,590,807, or U.S. Pat. No. 6,555,860, although the scope of the invention is not limited in this respect. Said patents are hereby incorporated herein in their entireties.

Figure 4:
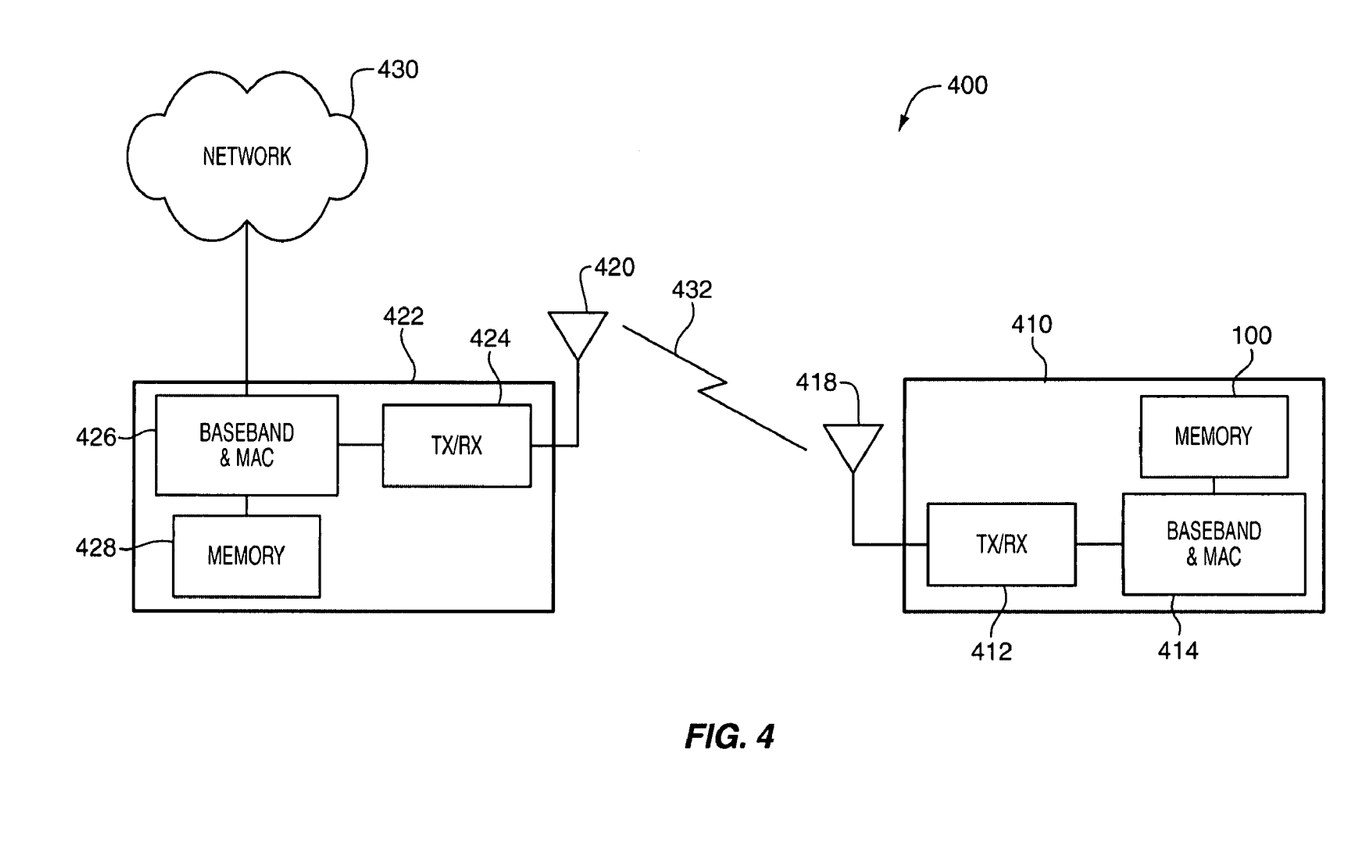
FIG. 4 is a block diagram of a wireless local or personal area network in which one or more devices on the network may utilize a MEMS memory device in accordance with one or more embodiments of the present invention and FIG. 5 is an elevation view of a schematic diagram of an alternative embodiment of a memory device as shown in FIG. 1 showing signals being provided to a MEMS platform via a capping layer in accordance with one embodiment of the present invention.

Referring now to FIG. 4, a wireless local or personal area network communication system in accordance with one embodiment of the present invention will be discussed. In the WLAN or WPAN communications system 400 shown in FIG. 4, a mobile unit 410 may include a wireless transceiver 412 to couple to an antenna 418 and to a processor 414 to provide baseband and media access control (MAC) processing functions. Processor 414 in one embodiment may comprise a single processor, or alternatively may comprise a baseband processor and an applications processor, although the scope of the invention is not limited in this respect. Processor 414 may couple to a memory 100 (FIG. 1) which may be the memory device 100 as shown in and described with respect to FIG. 4, although the scope of the invention is not limited in this respect.

Mobile unit 410 may communicate with access point 422 via wireless communication link 432, where access point 422 may include at least one antenna 420, transceiver 424, processor 426, and memory 428 which itself may also include memory device 428 as shown which may be the memory device 100 as described in FIG. 1. In an alternative embodiment, access point 422 and optionally mobile unit 410 may include two or more antennas, for example to provide a spatial division multiple access (SDMA) system or a multiple input, multiple output (MIMO) system, although the scope of the invention is not limited in this respect. Access point 422 may couple with network 430 so that mobile unit 410 may communicate with network 430, including devices coupled to network 430, by communicating with access point 422 via wireless communication link 432. Network 430 may include a public network such as a telephone network or the Internet, or alternatively network 430 may include a private network such as an intranet, or a combination of a public and a private network, although the scope of the invention is not limited in this respect. Communication between mobile unit 410 and access point 422 may be implemented via a wireless local area network (WLAN), for example a network compliant with a an Institute of Electrical and Electronics Engineers (IEEE) standard such as IEEE 802.11a, IEEE 802.11b, IEEE 802.11n, HiperLAN-II, the WiMedia Alliance, incoherent optical network, coherent optical network and so on, although the scope of the invention is not limited in this respect. In another embodiment, communication between mobile unit 410 and access point 422 may be at least partially implemented via a cellular communication network compliant with a Third Generation Partnership Project (3GPP or 3G) standard, although the scope of the invention is not limited in this respect.

It should be understood that embodiments of the present invention may be used in a variety of applications. Although the present invention is not limited in this respect, the circuits disclosed herein may be used in many apparatuses such as in the transmitters and receivers of a radio system. Radio systems intended to be included within the scope of the present invention include, by way of example only, wireless local area networks (WLAN) devices, wireless personal area (WPAN) network devices, and wireless wide area network (WWAN) devices including wireless network interface devices and network interface cards (NICs), base stations, access points (APs), gateways, bridges, hubs, cellular radiotelephone communication systems, satellite communication systems, two-way radio communication systems, one-way pagers, two-way pagers, personal communication systems (PCS), personal computers (PCs), personal digital assistants (PDAs), audio and-or video media players and the like, although the scope of the invention is not limited in this respect.

Types of wireless communication systems intended to be within the scope of the present invention include, although not limited to, Wireless Local Area Network (WLAN), Wireless Wide Area Network (WWAN), Code Division Multiple Access (CDMA) cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, and the like, although the scope of the invention is not limited in this respect.

Referring now to FIG. 5, an elevation view of a schematic diagram of an alternative embodiment of a memory device as shown in FIG. 1 showing signals being provided to a MEMS platform via a capping layer in accordance with one embodiment of the present invention will be discussed. In contrast to the memory device 100 shown in FIG. 1, the memory device 500 of FIG. 5 includes a MEMS platform 126 having rotor electrodes 132 positioned to interact with stator electrodes 140 disposed on capping layer 138 rather than being disposed on substrate 116. Control lines from the high voltage controller 122 may be brought in through capping layer 138 via wirebonds 510, through silicon vias 512 to contact electrodes 148 and 150. An electrostatic control voltage may be applied between electrodes 148 and 150 as shown in and described with respect to FIG. 1. Otherwise, the memory device 500 of FIG. 5 operates in the same manner as the memory device 100 of FIG. 1, and the scope of the invention is not limited in this respect.

Although the invention has been described with a certain degree of particularity, it should be recognized that elements thereof may be altered by persons skilled in the art without departing from the spirit and scope of the invention. It is believed that the MEMS probe based memory of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof, and further without providing substantial change thereto. It is the intention of the claims to encompass and include such changes.

What is claimed is:

1. An apparatus, comprising:
   a storage medium having two or more data storage material islands organized in an array, one or more data storage material islands being electrically isolated from other data storage material islands in the array;
   a MEMS platform having two or more probes, where at least one of the probes corresponds to one or more of the data storage material islands; and
   a mover system to position the MEMS platform relative to the storage medium to a selected area of the storage medium by applying a positioning force to the MEMS platform with respect to the storage medium;
   wherein data bits may be concurrently written to a first group of data storage material islands in the selected area by applying a write signal to the first group of data storage material islands with respect to a forcing function applied to the probes, and wherein a data bits may be unchanged for a second group of data storage material islands in the selected area by applying a hold signal that is within a predetermined threshold of the forcing function applied to the probes.

2. An apparatus as claimed in claim 1, wherein the forcing function is a bias voltage applied to the probes.

3. An apparatus as claimed in claim 1, wherein the positioning force is a dc voltage controlled via a higher voltage controller.

4. An apparatus as claimed in claim 1, wherein the data storage material islands comprise a chalcogenide material.

5. An apparatus as claimed in claim 1, wherein the memory layer further comprises a memory controller to couple to the storage medium.

6. An apparatus as claimed in claim 1, wherein the memory layer further comprises a complementary metal oxide semiconductor (CMOS) memory controller to couple to the storage medium.

7. An apparatus as claimed in claim 1, wherein the MEMS platform is suspended in the memory layer via springs.

8. An apparatus as claimed in claim 1, wherein the storage medium and the MEMS platform are hermetically sealed between a MEMS cap and a substrate.

9. An apparatus as claimed in claim 1, wherein the voltage is supplied to an electrode on the MEMS platform via an interconnect bump that interconnects a MEMS cap and a substrate that contain the storage medium and the MEMS platform.

10. An apparatus as claimed in claim 1, wherein the probes are operated at a relative ground potential.

11. An apparatus as claimed in claim 1, wherein a probe and data storage material island selection is performed via a memory controller disposed in a substrate.

12. An apparatus, comprising:
a storage medium having two or more data storage material islands organized in an array, one or more data storage material islands being electrically isolated from other data storage material islands in the array;
a MEMS platform having two or more probes, where at least one of the probes corresponds to one or more of the data storage material islands; and
a mover system to position the storage medium relative to the MEMS platform to a selected area of the storage medium by applying a positioning force to the storage medium with respect to the MEMS platform;
wherein data bits may be concurrently written to a first group of data storage material islands in the selected area by applying a write signal to the first group of data storage material islands with respect to a forcing function applied to the storage medium, and wherein a data bits may be unchanged for a second group of data storage material islands in the selected area by applying a hold signal that is within a predetermined threshold of the forcing function applied to the storage medium.

13. An apparatus as claimed in claim 12, wherein the forcing function is a bias voltage applied to the probes.

14. An apparatus as claimed in claim 12, wherein the positioning force is a dc voltage controlled via a higher voltage controller.

15. An apparatus as claimed in claim 12, wherein the data storage material islands comprise a chalcogenide material.

16. An apparatus as claimed in claim 12, wherein the memory layer further comprises a memory controller to couple to the storage medium.

17. An apparatus as claimed in claim 12, wherein the memory layer further comprises a complementary metal oxide semiconductor (CMOS) memory controller to couple to the storage medium.

18. An apparatus as claimed in claim 12, wherein the MEMS platform is suspended in the memory layer via springs.

19. An apparatus as claimed in claim 12, wherein the storage medium and the MEMS platform are hermetically sealed between a MEMS cap and a substrate.

20. An apparatus as claimed in claim 12, wherein the voltage is supplied to an electrode on the MEMS platform via an interconnect bump that interconnects a MEMS cap and a substrate that contain the storage medium and the MEMS platform.

21. An apparatus as claimed in claim 12, wherein the probes are operated at a relative ground potential.

22. An apparatus as claimed in claim 12, wherein a probe and data storage material island selection is performed via a memory controller disposed in a substrate.

23. A method, comprising:
applying a forcing function between a MEMS platform and a storage medium to position one or more probes of the MEMS platform near a selected location of the storage medium; and
performing a read operation or a write operation at the selected location of the storage medium by applying a read signal or a write signal between the selected location of the storage medium and the one or more probes;
wherein data bits may be concurrently written to a first group of data storage material islands of the storage medium in the selected location by applying a read signal or a write signal to the first group of data storage material islands with respect to a forcing function applied to the MEMS platform, and wherein a data bits may be unchanged for a second group of data storage material islands of the storage medium in the selected area by applying a hold signal that is within a predetermined threshold of the forcing function applied to the MEMS platform.

24. A method as claimed in claim 23, wherein said performing occurs while maintaining the probe at a relative ground potential.

25. A method as claimed in claim 23, wherein the forcing function is applied via a higher voltage source.

26. A method as claimed in claim 23, wherein said performing does not require heating of the probe.

27. A method as claimed in claim 23, wherein said performing includes multiplexing performed via the storage medium without requiring multiplexing performed via the MEMS platform.

28. An apparatus, comprising:
a transceiver and an omnidirectional antenna to couple to the transceiver;
a baseband processor to couple to the transceiver; and
a memory device to couple to the baseband processor, wherein the memory device comprises:
a storage medium having two or more data storage material islands organized in an array, one or more data storage material islands being electrically isolated from other data storage material islands in the array;
a MEMS platform having two or more probes, where at least one of the probes corresponds to one or more of the data storage material islands; and
a mover system to position the MEMS platform relative to the storage medium to a selected area of the storage medium by applying a positioning force to the MEMS platform with respect to the storage medium;

wherein data bits may be concurrently written to a first group of data storage material islands in the selected area by applying a write signal to the first group of data storage material islands with respect to a forcing function applied to the probes, and wherein a data bits may be unchanged for a second group of data storage material islands in the selected area by applying a hold signal that is within a predetermined threshold of the forcing function applied to the probes.

29. An apparatus as claimed in claim 28, wherein the forcing function is a bias voltage applied to the probes.

30. An apparatus as claimed in claim 28, wherein the positioning force is a dc voltage controlled via a higher voltage controller.

31. An apparatus as claimed in claim 28, wherein the data storage material islands comprise a chalcogenide material.

32. An apparatus as claimed in claim 28, wherein the memory layer further comprises a memory controller to couple to the storage medium.

33. An apparatus as claimed in claim 28, wherein the probes are operated at a relative ground potential.

34. An apparatus as claimed in claim 28, further comprising a capping layer having a first electrode, and said MEMS platform having a second electrode, wherein the MEMS platform may be manipulated with respect to the data storage medium via an electrostatic voltage selectively applied between the first and second electrodes.

35. An apparatus, comprising:
a storage medium having two or more data storage material islands organized in an array, one or more data storage material islands being electrically isolated from other data storage material islands in the array;
a memory controller disposed in a substrate to control read and write operations for the storage medium;
an array of two or more probes disposed on the substrate, where at least one of the probes corresponds to one or more of the data storage material islands; and
a mover system to position the storage medium relative to the array of probes to a selected area of the storage medium by applying a positioning force to the storage medium with respect to the array of probes;
wherein data bits may be concurrently written to a first group of data storage material islands in the selected area by applying a write signal to the first group of data storage material islands with respect to a forcing function applied to the storage medium, and wherein a data bits may be unchanged for a second group of data storage material islands in the selected area by applying a hold signal that is within a predetermined threshold of the forcing function applied to the storage medium.

36. An apparatus as claimed in claim 35, wherein the forcing function includes a bias voltage applied to the probes.

37. An apparatus as claimed in claim 35, wherein the positioning force is a dc voltage controlled via a higher voltage controller.

38. An apparatus as claimed in claim 35, wherein the data storage material islands comprise a chalcogenide material.

39. An apparatus as claimed in claim 35, wherein the probes are operated at a relative ground potential.

40. An apparatus as claimed in claim 35, wherein the storage medium and the array of probes are hermetically sealed within a MEMS cap coupled to the substrate.

* * * * *